(12) United States Patent
Takeda

(10) Patent No.: US 8,164,962 B2
(45) Date of Patent: Apr. 24, 2012

(54) SEMICONDUCTOR MEMORY APPARATUS

(75) Inventor: Koichi Takeda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 294 days.

(21) Appl. No.: 12/585,495

(22) Filed: Sep. 16, 2009

(65) Prior Publication Data

US 2010/0091590 A1   Apr. 15, 2010

(30) Foreign Application Priority Data

Oct. 10, 2008   (JP) .................. 2008-264008
Sep. 10, 2009   (JP) .................. 2009-209072

(51) Int. Cl.
*G11C 7/00*   (2006.01)
(52) U.S. Cl. .................. 365/191; 365/207; 365/154
(58) Field of Classification Search .................. 365/191, 365/207, 154, 189.08, 156, 226, 185.01, 365/185.07, 185.05

See application file for complete search history.

(56) References Cited

U.S. PATENT DOCUMENTS

| | | | |
|---|---|---|---|
| 5,534,800 A | | 7/1996 | Hiraki et al. |
| 6,011,711 A | * | 1/2000 | Hodges et al. .................. 365/154 |
| 2007/0025169 A1 | * | 2/2007 | Houston .................. 365/206 |

FOREIGN PATENT DOCUMENTS

JP   6-119784   4/1994

OTHER PUBLICATIONS

Kawasumi, A. et al., in "A Single-Power-Supply 0.7V 1GHz 45nm SRAM with an Asymmetrical Unit B-ratio Memory Cell", IEEE International Solid-State Circuits Conference (2008), pp. 382, 383, and 622.

Byung-Do Yang et al. in "A Low-Power SRAM Using Hierarchical Bit Line and Local Sense Amplifiers", IEEE Journal of Solid-State Circuits, vol. 40, No. 6, Jun. 2005, pp. 1366 to 1376.

* cited by examiner

*Primary Examiner* — Dang Nguyen
(74) *Attorney, Agent, or Firm* — McGinn Intellectual Property Law Group, PLLC

(57) ABSTRACT

A semiconductor memory apparatus includes an SRAM circuit having first SRAM cells that store data and second SRAM cells that amplify a potential difference of the data and store the potential difference, a word line driver circuit that outputs a first control signal for selecting one of the first SRAM cells to be read/written the data and a second control signal for selecting one of the second SRAM cells to be read/written the potential difference, a sense amplifier circuit that amplifies a potential difference of a read signal output from a bit line pair of the second SRAM cell selected according to the second control signal, and a write driver circuit that outputs a write signal to the bit line pair of the second SRAM cell selected according to the second control signal, and the write signal has a potential difference between bit lines larger than the read signal.

19 Claims, 13 Drawing Sheets

SEMICONDUCTOR MEMORY APPARATUS

BACKGROUND

1. Field of the Invention

The present invention relates to a semiconductor memory apparatus, and particularly to a static random access memory.

2. Description of Related Art

Because of the high process compatibility of a Static Random Access Memory (hereinafter referred to as an SRAM), SRAMs have been heretofore mounted to various functional blocks such as CPU. Higher integration and higher speed of a semiconductor apparatus have been achieved by miniaturizing transistors, which are basic elements of the semiconductor apparatus. SRAMs mounted to semiconductor apparatuses are also required to be miniaturized.

FIG. 2 illustrates an SRAM of a related art. FIG. 2 illustrates a SRAM memory cell (hereinafter referred to as an SRAM cell) of a related art including 6 transistors. Access transistors N3 and N4 are switched ON/OFF according to a voltage level of a first word line WL. Further, data (memory data) is held by a latch which is composed of 2 CMOS (Complementary Metal Oxide Semiconductor) inverters.

FIG. 10 illustrates the entire structure of an SRAM according to a related art in which the SRAM cells of FIG. 2 are arranged two-dimensionally. In the circuit of FIG. 10, an SRAM cell is accessed by a first word line WL, and a first bit line pair BL0 and BL1. In a read operation, the first word line WL is activated according to a row address signal RA. This turns on the access transistors N3 and N4, which are provided to all the SRAM cells connected to the corresponding first word line WL. That is, a memory node pair (drain terminal side nodes of N3 and N4 in FIG. 2) is connected to the first bit line pair BL0 and BL1 (source terminal side nodes of N3 and N4), which is charged with a power supply voltage VDD, and memory data is output to the first bit line pair BL0 and BL1. Next, the first bit line pair BL0 and BL1 is selected according to a column address signal CA by a bit line pair selector SEL, and then output. A signal output from the bit line pair selector SEL is input to a sense amplifier SA. A potential difference of the signals input to the sense amplifier SA is amplified, and then output as a read signal. For a stable read out operation, sufficient read margin must be ensured in all the SRAM cells selected by the row address signal RA.

For a write operation, the first bit line pair BL0 and BL1 is selected by the bit line pair selector SEL according to the column address signal CA. The selected first bit line pair BL0 and BL1 is connected to a write driver WD. At this time, the write driver WD discharges either the first bit line pair BL0 or BL1 to generate a potential difference between BL0 and BL1. For example, if write data is "1", the bit line BL1 is discharged to reduce the voltage level. If the write data is "0", the bit line BL0 is discharged to reduce the voltage level. Next, the first word line WL is activated according to the row address signal RA. Then the data is written to the selected SRAM cell. While the row address signal RA is activated at this time, a pseudo read operation is performed to the SRAM cells not selected by the column address signal CA. For a stable write operation, sufficient write margin must be ensured in the SRAM cell selected by the column address signal CA, and sufficient read margin must also be ensured in the SRAM cell not selected by the column address signal CA.

In recent years, along with the miniaturization of CMOS processes, the increase in the device variation in transistors making up a SRAM cell is becoming prominent. The increase in the device variation causes issues such that memory data can easily be destroyed in a SRAM cell at the time of a read operation, and that a read current decreases thereby reducing a read speed. As a result, problems are generated including a decrease in yield of a large scale semiconductor memory apparatus. Accordingly, in order to ensure a constant yield, SRAM cell size must be increased to reduce the device variation.

The solution against such issues is suggested by Kawasumi, A. et al., in "A Single-Power-Supply 0.7V 1 GHz 45 nm SRAM with an Asymmetrical Unit β-ratio Memory Cell", IEEE International Solid-State Circuits Conference (2008), pp.382, 383, and 622. FIG. 11 illustrates the entire configuration of the semiconductor memory apparatus disclosed by Kawasumi, A. et al. In the example of the circuit illustrated in FIG. 11, a measure is taken to increase the number of dividing a SRAM cell array. That is, the number of SRAM cells controlled by one set of SRAM control circuits (local read/write circuits) is reduced. In the example of the circuit illustrated in FIG. 11, the number of SRAM cells per bit line pair is reduced to 16, so that the load capacity of the bit line pair is reduced. This reduces the charging time of a bit line at the time of reading. Consequently, this solves not only the issue that the read current and read speed decrease, but also the issue that the memory data can easily be destroyed. The memory data is destroyed at the time of reading by a charge from a bit line pair charged with the power supply voltage VDD flowing into a memory node pair of an SRAM cell that holds low-level. Accordingly, the amount of charge flowing from the bit line pair to the memory node pair decreases by transmitting the memory data quickly to the bit line pair, and thus destruction of memory data can be prevented.

As described so far, in order to improve the read margin of a semiconductor memory apparatus, it is effective to increase the number of dividing an SRAM cell array. In order to improve the read margin without increasing the whole area of a semiconductor memory apparatus, the size of local read/write circuits must be reduced as much as possible. In the circuit of the related art illustrated in FIG. 11, a local read circuit and a local write circuit are made up of 19 transistors in total. It is noted that the local read circuit and the local write circuit are shared by the two SRAM cell arrays, so the number of practical transistors is 9.5, which is a half of all the transistors.

FIG. 12 illustrates a sense amplifier (local read circuit) disclosed in Japanese Unexamined Patent Application Publication No. 6-119784. This sense amplifier and the SRAM cells are connected via a first bit line pair BL and /BL and make up a two-step sense circuit. The sense amplifier disclosed in Japanese Unexamined Patent Application Publication No. 6-119784 does not drive the first bit line pair BL and /BL, so as to increase the read speed and reduce the power consumption.

FIG. 13 is a block diagram of a semiconductor memory apparatus disclosed by Byung-Do Yang et al. in "A Low-Power SRAM Using Hierarchical Bit Line and Local Sense Amplifiers", IEEE Journal of Solid-State Circuits, vol.40, No. 6, June, 2005, pp.1366 to 1376. The circuit illustrated in FIG. 13 includes a local sense amplifier LSA (local read/write circuits), an access transistor for controlling input/output signals of the local sense amplifier LSA, and multiple SRAM cells. In the circuit disclosed by Byung-Do Yang et al., a word line GWL for controlling the access transistor to be ON/OFF is common to the local sense amplifiers.

SUMMARY

As described so far, in order to improve the read margin of a semiconductor memory apparatus, it is effective to increase the number of dividing an SRAM cell array. However when increasing the number of dividing an SRAM cell array, local read/write circuits also increases. The present inventors have found a problem that if the areas of the local read/write circuits are large as in the related arts, the cell occupancy in an SRAM cell is reduced. That is, in semiconductor memory apparatuses of the related arts, there was a problem such that the circuit size increases by providing local read/write circuits.

Further, in the semiconductor memory apparatus of the related art illustrated in FIG. 13, in which the global bit line and a local bit line are connected by a PMOS access transistor and the PMOS access transistor also performs a precharge operation of the local bit line, there were problems such that the control method is complicated, and the circuit size and the power consumption of the control circuit increase.

An exemplary aspect of the present invention is a semiconductor memory apparatus including an SRAM circuit comprising first SRAM cells (for example first SRAM cells 101 in the first exemplary embodiment of the present invention) that store data and second SRAM cells (for example second SRAM cells 102 in the first exemplary embodiment of the present invention) that amplify a potential difference of the data and store the potential difference, a word line control circuit (for example a word line driver circuit 303 in the first exemplary embodiment of the present invention) that outputs a first control signal (for example a first word line WL in the first exemplary embodiment of the present invention) for selecting one of the first SRAM cells to be read/written the data and a second control signal (for example a second word line YS in the first exemplary embodiment of the present invention) for selecting one of the second SRAM cells to be read/written the potential difference, a sense amplifier circuit (for example a sense amplifier circuit 304 in the first exemplary embodiment of the present invention) that amplifies a potential difference of a read signal, where the read signal is output from a bit line pair (for example a second bit line pair GBL0 and GBL1 in the first exemplary embodiment of the present invention) of the second SRAM cell selected according to the second control signal, and a write control circuit (for example a write driver circuit 305 in the first exemplary embodiment of the present invention) that outputs a write signal to the bit line pair of the second SRAM cell selected according to the second control signal, where the write signal has a potential difference between bit lines larger than the read signal.

With the abovementioned circuit configuration, local read/write circuits can be made up of less number of transistors, and thus enabling to restrain from increasing the circuit size.

The present invention provides a semiconductor memory apparatus with a smaller circuit size by making up local read/write circuits with less number of transistors.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Figure 1:
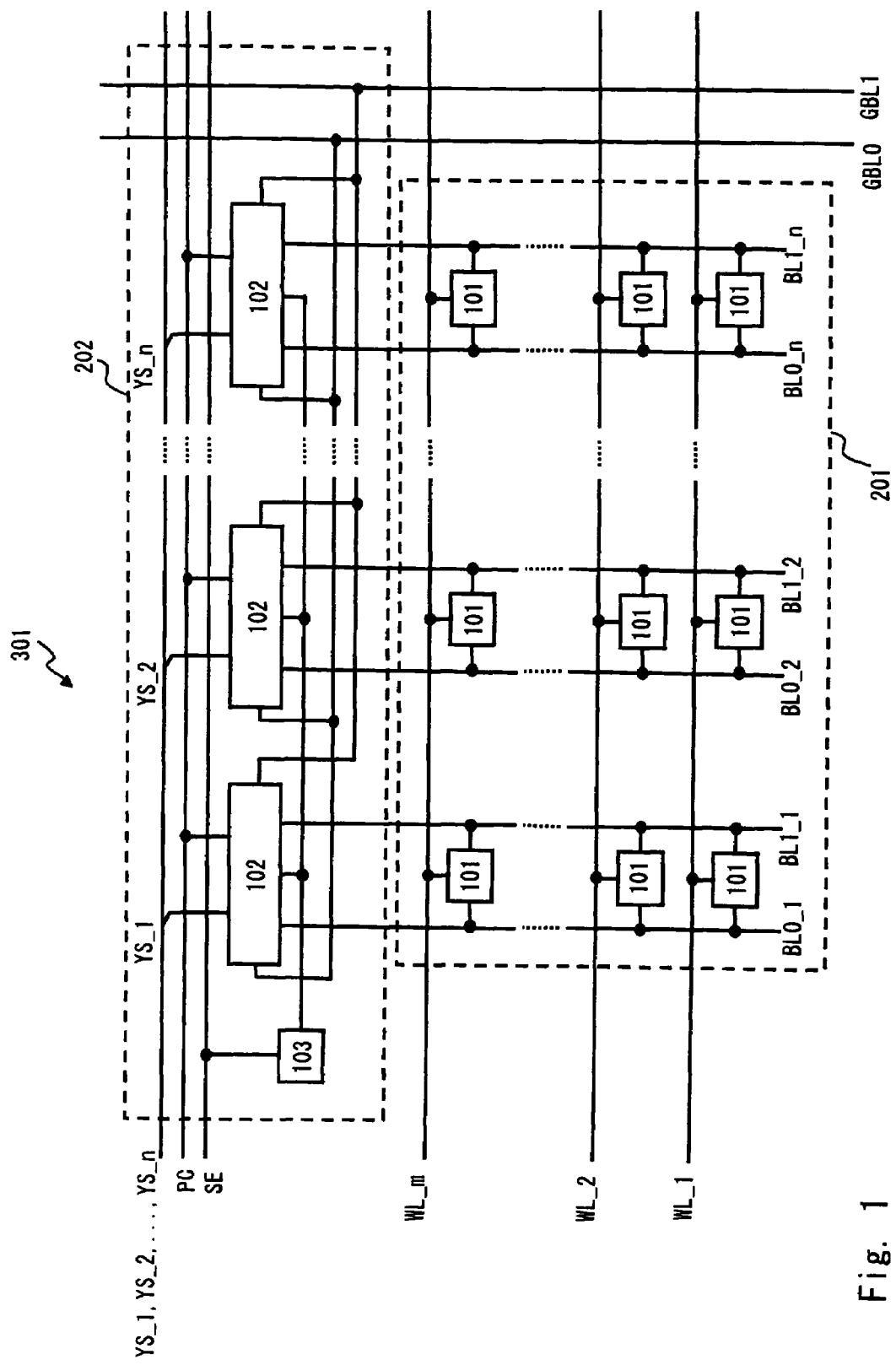
FIG. 1 illustrates an SRAM block according to a first exemplary embodiment of the present invention.

FIG. 1 illustrates a basic configuration of an SRAM block 301 (SRAM circuit) included in a semiconductor memory apparatus according to the first exemplary embodiment of the present invention. The SRAM block 301 of the present invention is provided with a SRAM cell array 201 for storing data and a SRAM cell array 202 for transmitting and receiving signals to/from outside. The SRAM block 301 includes a first word line (first control signal) WL, a second word line (second control signal) YS, a sense amplifier control signal SE, a precharge enable signal PC, a first bit line pair BL0 and BL1, and a second bit line pair GBL0 and GBL1. The SRAM cell array 201 includes m×n (m and n are integers of 1 or more) number of SRAM cells 101 arranged in a matrix. The SRAM cell array 202 includes n (n is an integer of 1 or more) number of second SRAM cells 102, which are arranged in the row direction, and a sense amplifier enable circuit 103 (amplification control circuit). For convenience, "WL", "YS", "BL0", "BL1", "GBL0", and "GBL1" indicate each signal line and also signals thereof.

Next, the circuit configuration of the SRAM block 301 is explained with reference to the circuit of FIG. 1. To the SRAM cell array 201, m number of the first word lines WL wired in the column direction and n pairs of the first bit line pairs BL0 and BL1 wired in the row direction are connected. In the following explanation, each of the m number of the first word lines WL is denoted by first word line WL_i (i is any integer from 1 to m). Further, each of the n pairs of the first bit line pairs BL0 and BL1 is denoted by BL0_j and BL1_j (j is any integer from 1 to n). Among m×n number of the first SRAM cells 101 provided to the SRAM cell array 201, n number of the first SRAM cells 101 placed in the i$^{th}$ line are connected to the first word line WL_i.

To the SRAM cell array 202, n number of the second word lines YS wired in the row direction, one sense amplifier control signal SE and one precharge enable signal PC wired in the row direction, and one pair of the second bit line pair GBL0 and GBL1 wired in the column direction are connected. In the following explanation, each of the n number of the second word line YS are denoted by a second word line YS_j (j indicates an integer from 1 to n). Among the n number of the second SRAM cells 102 provided to the SRAM cell array 202 and arranged in the row direction, the second SRAM cell 102 placed in the $i^{th}$ column is connected to the second word line YS_j. Each of the second SRAM cells 102 is connected to the precharge enable signal PC, one pair of the second bit line pair GBL0 and GBL1, and the sense amplifier enable signal (amplification control signal) SAN output from the sense amplifier enable circuit 103. The sense amplifier enable circuit 103 is also connected to the sense amplifier control signal SE.

Further, the SRAM cell array 201 and the SRAM cell array 202 are connected via the first bit line pair BL0 and BL1. Specifically, the second SRAM cell 102, which is provided to the SRAM cell array 202 and inputs the second word line YS_j, is connected to m number of the first SRAM cells 101, which are provided to the SRAM cell array 201 and placed in the $j^{th}$ column, via the first bit line pair BL0_j and BL1_j.

Figure 2:
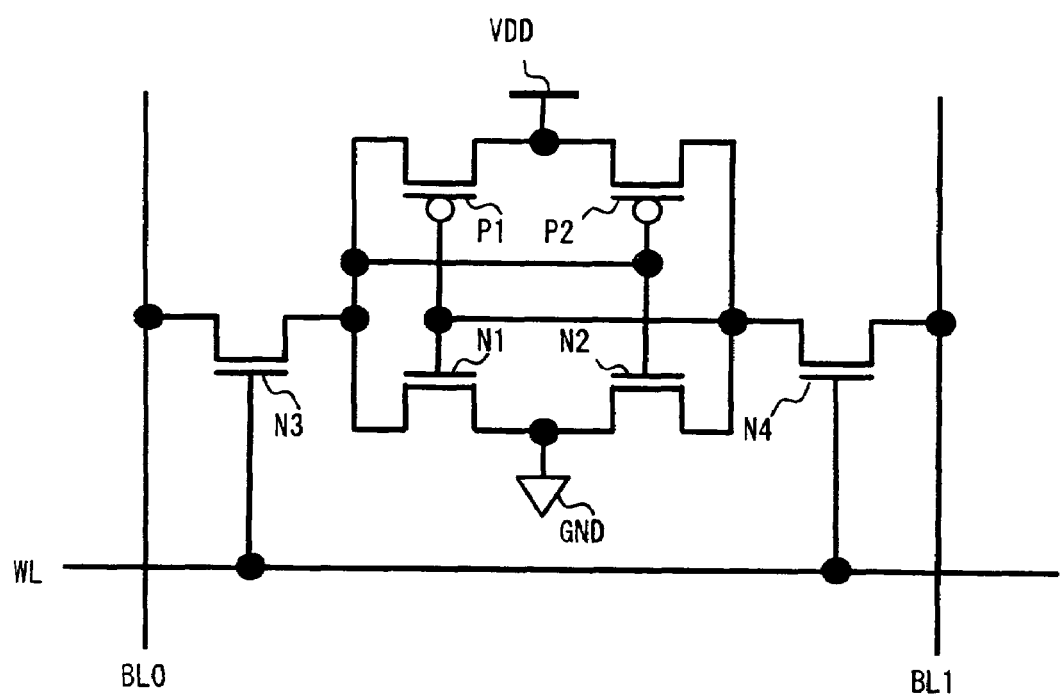
FIG. 2 illustrates a configuration example of a first SRAM cell used in the present invention.

FIG. 2 illustrates the circuit of the first SRAM cell 101. As shown in the circuit of FIG. 2, the first SRAM cell 101 is a common SRAM cell having 6 transistors. This first SRAM cell 101 includes NMOS drive transistors N1 and N2, NMOS access transistors N3 and N4, and PMOS load transistors P1 and P2. Further, the first SRAM cell 101 includes a source voltage terminal VDD and a ground voltage terminal GND. For convenience, the signs "VDD" and "GND" indicate terminal names and also a power supply voltage and a ground voltage, respectively.

A drain of N1, a gate of N2, a drain of P1, a gate of P2, and a drain of N3 are connected to each other via one side of the first memory node pair. A gate of N1, a drain of N2, a gate of P1, a drain of P2, and a drain of N4 are connected to each other via the other side of the first memory node pair. A source of N1 and a source of N2 are connected to the ground voltage terminal VSS. A source of P1 and a source of P2 are connected to the source voltage terminal VDD. A source of N3 is connected to one side of the first bit line pair, BL0. A gate of N3 is connected to the first word line WL. A source of N4 is connected to the other side of the first bit line pair, BL1. A gate of N4 is connected to the first word line WL.

N1 and P1 make up one set of CMOS inverter circuit. N2 and P2 make up another set of CMOS inverter circuit. That is, currents flowing between the source and the drain of N1 and P1 are controlled to be ON/OFF according to a signal input to the gates of N1 and P1. Then an inverted signal is output from the drain of N1 or P1. The signal output from the drain of N1 or P1 is input to the gates of N2 and P2. The currents flowing between the source and drain of N2 and P2 are controlled to be ON/OFF in response to the signal input to the gates of N1 and P1. Then an inverted signal is output from the drain of N2 or P2. The signal output from the drain of N2 or P2 is input to the gates of N1 and P1. As described so far, the first SRAM cell 101 includes 2 CMOS inverters connected in a loop and holds a voltage level of the stored signal as a data (hereinafter referred to as memory data). The memory data is read out or written by controlling ON/OFF of the currents flowing between the source and the drain of N3 and N4.

Figure 3:
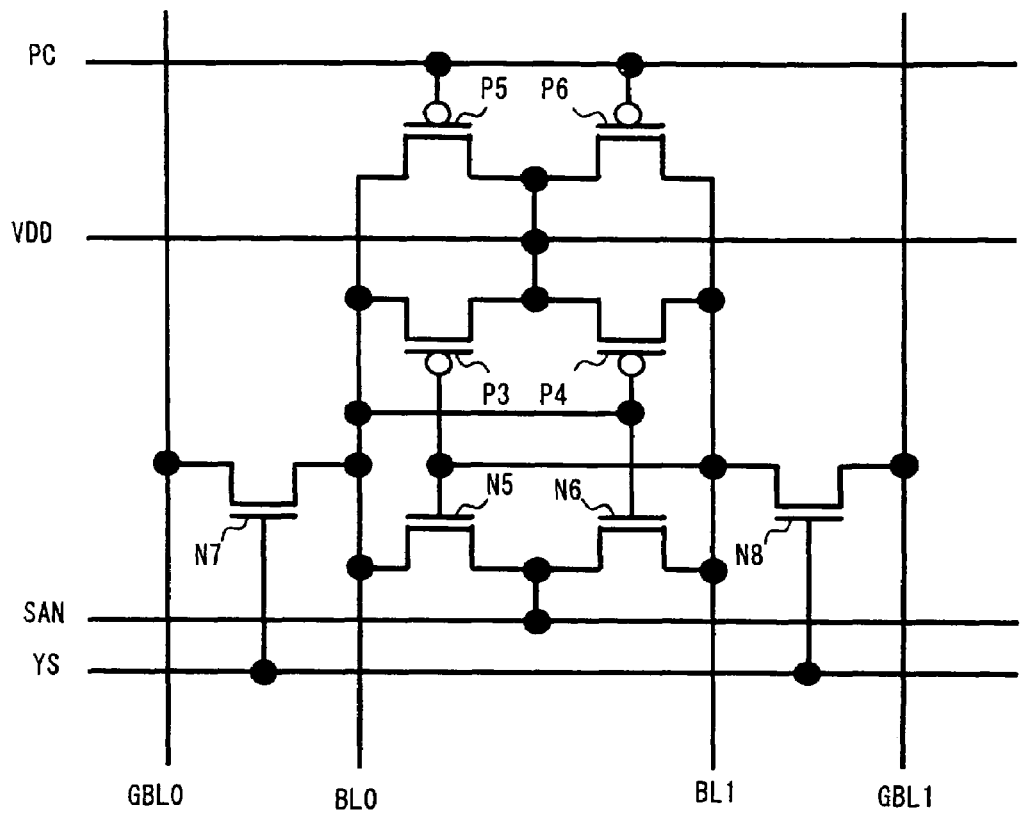
FIG. 3 illustrates a configuration example of a second SRAM cell used in the present invention.
Figure 12:
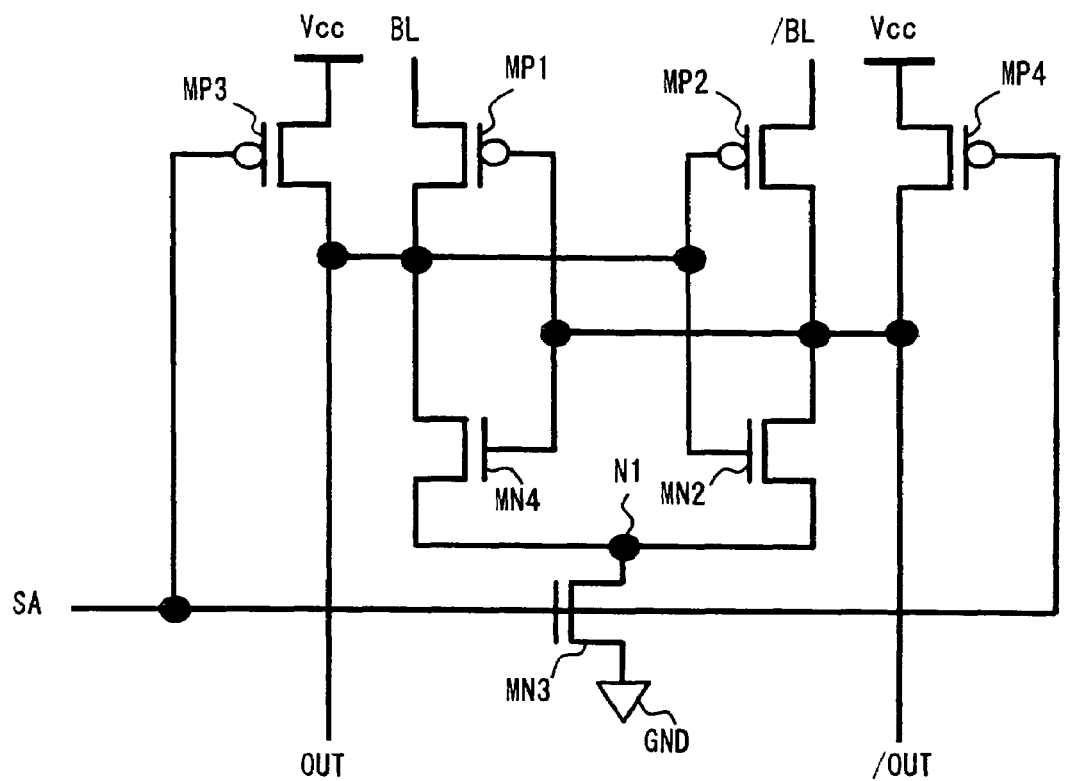
FIG. 12 illustrates a sense amplifier according to a related art.

FIG. 3 illustrates the circuit of the second SRAM cell 102. As shown in the circuit of FIG. 3, the second SRAM cell 102 includes NMOS access transistors N7 and N8, NMOS drive transistors N5 and N6, PMOS load transistors P3 and P4, and PMOS precharge transistors P5 and P6. As compared with the circuit illustrated in FIG. 3, the circuit of a related art illustrated in FIG. 12 is not provided with transistors corresponding to the access transistor N7 and N8.

A drain of N5, a gate of N6, a drain of P3, a gate of P4, a drain of P5, and a drain of N7 are connected to one side of the second memory node pair, which is one of the first bit line pair, BL0. A gate of N5, a drain of N6, a gate of P3, a drain of P4, a drain of P6, and a drain of N8 are connected to the other side of the second memory node pair, which is the other side of the first bit line pair, BL1.

A source of P3, a source of P4, a source of P5, and a source of P6 are connected to the source voltage terminal (high potential side power supply terminal) VDD. A gate of P5 and a gate of P6 are connected to the precharge enable signal PC. A source of N5 and a source of N6 are connected to the sense amplifier enable signal SAN (low potential side power supply terminal). A source of N7 is connected to one side of the second bit line pair, GBL0. A gate of N7 is connected to the second word line YS. A source of N8 is connected to the other side of the second bit line pair, GBL1. A gate of N8 is connected to the second word line YS. The circuit configuration of N5, N6, N7, N8, P3, and P4 which are provided to the second SRAM cell 102 of FIG. 3 is same as that of the first SRAM cell 101.

Specifically, the second memory node pair of the second SRAM cell 102, which is provided to the SRAM cell array 202 and placed to the $j^{th}$ column (the second word line YS_j is input to the gates of N7 and N8), is connected to m number of the first SRAM cells 101, which are provided to the SRAM cell array 201 and placed in the $j^{th}$ column, via the first bit line pair BL0_j and BL1_j.

Figure 4:
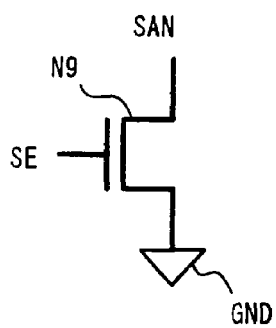
FIG. 4 illustrates a sense amplifier enable circuit used in the present invention.

FIG. 4 illustrates the sense amplifier enable circuit 103. As shown in the circuit of FIG. 4, the sense amplifier enable circuit 103 is made up of an NMOS transistor N9. A source of N9 is connected to the ground voltage terminal GND. The gate of N9 is connected to the sense amplifier control signal SE. The drain of N9 is connected to the sense amplifier enable signal SAN. That is, the current flowing between the source and the drain of N9 is controlled to be ON/OFF according to a voltage level of the sense amplifier control signal SE, which is applied to the gate of N9. Then, a signal output from the drain of N9 is input to n number of the second SRAM cells 102 provided to the SRAM cell array 202, as the sense amplifier enable signal SAN.

In the circuit of FIG. 3, for example if P5 and P6 are turned on, the power supply voltage VDD is supplied to the second memory node pair of the second SRAM cell 102, which is the first bit line pair BL0 and BL1. Accordingly, the second SRAM cell 102 is in an undefined state and does not hold memory data.

Moreover, for example if P5 and P6 are turned off, N9 of the sense amplifier enable circuit 103 is turned off and a current does not flow between the source and drain, the voltage between the sources of N5 and N6 is not fixed to the ground voltage GND. Thus the second SRAM cell 102 is in the undefined state and does not hold memory data.

Furthermore, if for example P5 and P6 are turned off and the sense amplifier enable signal SAN indicates the ground voltage GND, the second SRAM cell 102 holds memory data in a similar way as the first SRAM cell 101. The memory data is read out or written by controlling ON/OFF of the currents flowing between the source and the drain of N7 and N8.

Figure 5:
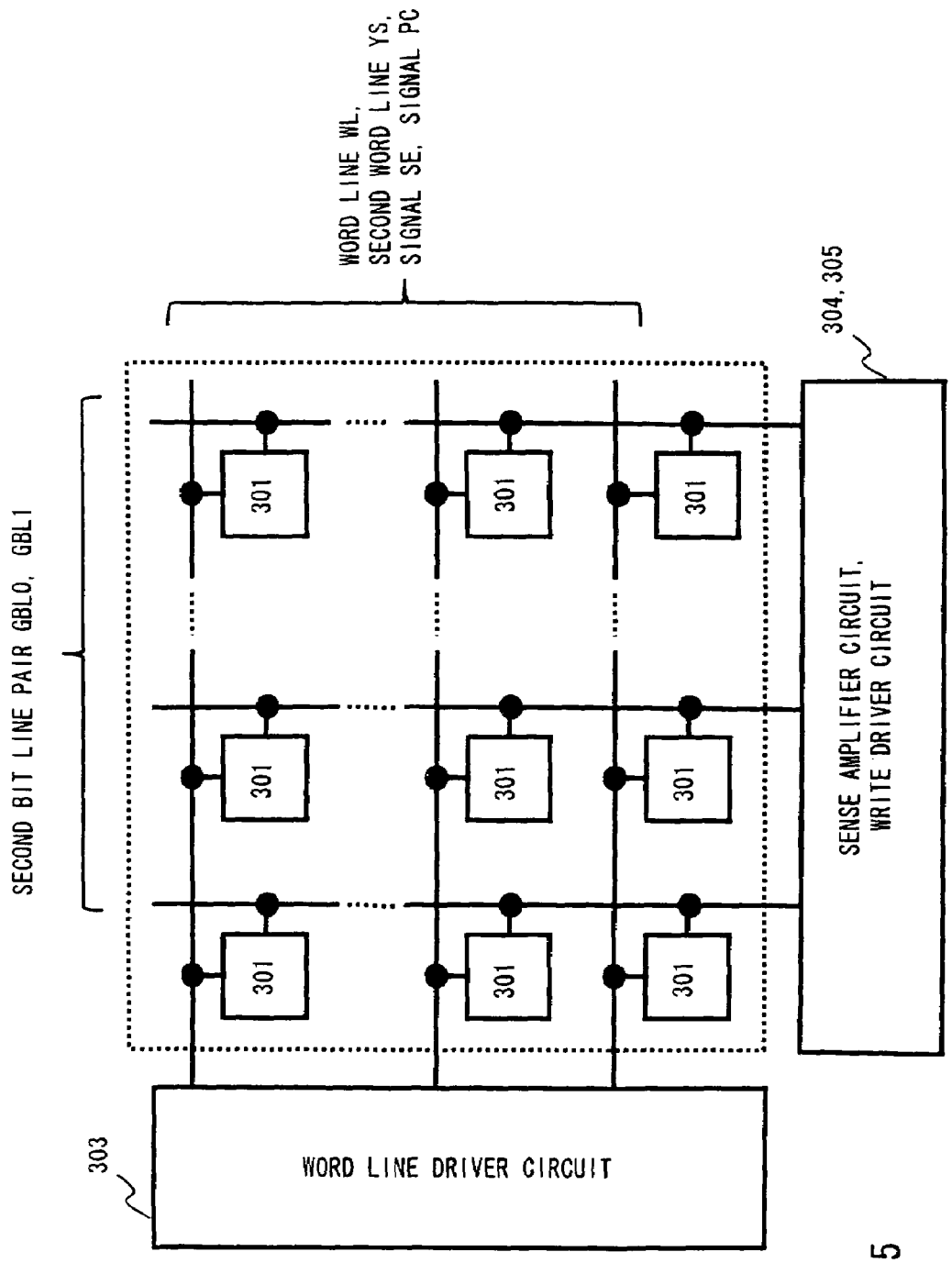
FIG. 5 illustrates an entire configuration example of a semiconductor memory apparatus according the first exemplary embodiment of the present invention.

FIG. 5 illustrates the entire configuration of the semiconductor memory apparatus according to the first exemplary embodiment of the present invention. The circuit illustrated in FIG. 5 is provided with one or more SRAM blocks 301 arranged in a matrix, a word line driver circuit (word line control circuit) 303, a sense amplifier 304, and a write driver circuit (write control circuit) 305.

The first word line WL, the second word line YS, the sense amplifier control signal SE, and the precharge enable signal PC, which are connected to the word line driver circuit 303, are wired in the row direction. Then, the first word line WL, the second word line YS, the sense amplifier control signal SE, and the precharge enable signal PC are connected to each of the SRAM blocks 301. The second bit line pair GBL0 and GBL1, which is connected to the sense amplifier circuit 304 and the write driver circuit 305, is wired in the column direction. Then, the second bit line pair GBL0 and GBL1 is connected to each of the corresponding SRAM blocks 301.

Next, the operation of the semiconductor memory apparatus according to the first exemplary embodiment of the present invention is explained with reference to FIG. 6. At standby time, voltage levels of all of the first word line WL, all of the second word line YS, the signal SE, and the signal PC indicate the ground voltage GND. As the first word line WL controls N3 and N4 to be OFF, the first SRAM cell 101 keeps holding the memory data, which has already been stored. Further, as the signal PC controls P5 and P6 to be ON, the power supply voltage VDD is supplied to the second memory node pair of the second SRAM cell 102, which is the first bit line pair BL0 and BL1. The second SRAM cell 102 is in the undefined state and does not hold memory data.

A read operation of the semiconductor memory apparatus according to the first exemplary embodiment of the present invention is explained hereinafter. The voltage levels of the second bit line pair GBL0 and GBL1 before the read operation indicate the power supply voltage VDD. In the SRAM block 301 including the SRAM cell array 201 having m×n (m and n are integers of 1 or more) number of the first SRAM cells 101 arranged in a matrix and the SRAM cell array 202 having n number of the second SRAM cells 102 arranged in the row direction, a case is described when reading out memory data of the first SRAM cell 101 placed to the $i^{th}$ row (i is any integer from 1 to m) and the $j^{th}$ column (j is any integer from 1 to n).

Firstly, P5 and P6 are controlled to be OFF by the signal PC changing to the power supply voltage VDD. Next, N3 and N4 are controlled to be ON by the first word line WL_i connected to the first SRAM cell 101 changing to the power supply voltage VDD. Then, the memory data held in the first SRAM cell 101 is output to the first bit line pair BL0_j and BL1_j.

N9 included in the sense amplifier enable circuit 103 is controlled to be ON by the signal SE changing to the power supply voltage VDD after a potential difference is generated between BL0_j and BL1_j. Then the signal SAN changes to the ground voltage GND, and the voltage levels of the source terminals of N5 and N6 change to the ground voltage GND. The second SRAM cell 102 amplifies the potential difference between the first bit line pair BL0_j and BL1_j (second memory node pair) and also holds the amplified memory data (the potential difference of the data).

Next, the second word line YS_j a is any integer from 1 to n) connected to the second SRAM cell 102 changes to the power supply voltage VDD to control N7 and N8 to be ON. Then the memory data held in the second SRAM cell 102 is output to the second bit line pair GBL0 and GBL1. After a potential difference is generated between GBL0 and GBL1, the sense amplifier circuit 304 connected to the second bit line pair GBL0 and GBL1 amplifies the potential difference and outputs the amplified potential difference as a read signal. The second SRAM cell 102 has a function as a local read circuit which controls the read operation of m (m is an integer of 1 or more) number of the first SRAM cells 101 placed in the $j^{th}$ column, for example.

A write operation of the semiconductor memory apparatus according to the first exemplary embodiment of the present invention is explained hereinafter. Note that the voltage levels of the second bit line pair GBL0 and GBL1 before the write operation indicate the power supply voltage VDD. In the SRAM block 301 including the SRAM cell array 201 having m×n (m and n are integers of 1 or more) number of the first SRAM cells 101 arranged in a matrix and the SRAM cell array 202 having n number of the second SRAM cells 102 arranged in the row direction, a case is described when writing memory data to the first SRAM cell 101 placed to the $i^{th}$ row (i is any integer from 1 to m) and the $i^{th}$ column (j is any integer from 1 to n).

Firstly, P5 and P6 are controlled to be OFF by changing the signal PC to the power supply voltage VDD. Next, N3 and N4 are controlled to be ON by the first word line WL_i connected to the first SRAM cell 101 changing to the power supply voltage VDD. Further, N9 included in the sense amplifier enable circuit 103 is controlled to be ON by the signal SE changing to the power supply voltage VDD. Then the sense amplifier enable signal SAN changes to the ground voltage GND, and the voltage levels of the source terminals of N5 and N6 also change to the ground voltage GND.

On the other hand, the write driver circuit 305 connected to the second bit line pair GBL0 and GBL1 outputs a write signal to the second bit line pair GBL0 and GBL1 and discharges one of GBL0 and GBL1 to generate a potential difference between GBL0 and GBL1.

N7 and N8 provided to the second SRAM cell 102 are controlled to be ON by the second word line YS_j changing to the power supply voltage VDD. Then, signals of the second bit line pair GBL0 and GBL1 are input respectively to the first bit line pair BL0_j and BL1_j (second memory pair). The second SRAM cell 102 amplifies the potential difference of the second memory node pair and also holds the amplified memory data (the potential difference of the data).

As N3 and N4 provided to the first SRAM cell 101 are turned on, the memory data amplified by the second SRAM cell 102 is written to the first SRAM cell 101 via the first bit line pair BL0_j and BL1_j. The second SRAM cell 102 has a function as a local write circuit which controls the write operation of m (m is an integer of 1 or more) number of the first SRAM cells 101 placed to the $j^{th}$ column, for example.

As described above, in the first exemplary embodiment of the present invention, the second SRAM cell 102 provided to the SRAM cell array 202 has functions as local read/write circuits and thus can be composed of less number of transistors than related arts. This enables to increase the number of dividing the SRAM cell array. As a result, the read margin of an SRAM cell can be improved and the operation speed can be increased.

Figure 11:
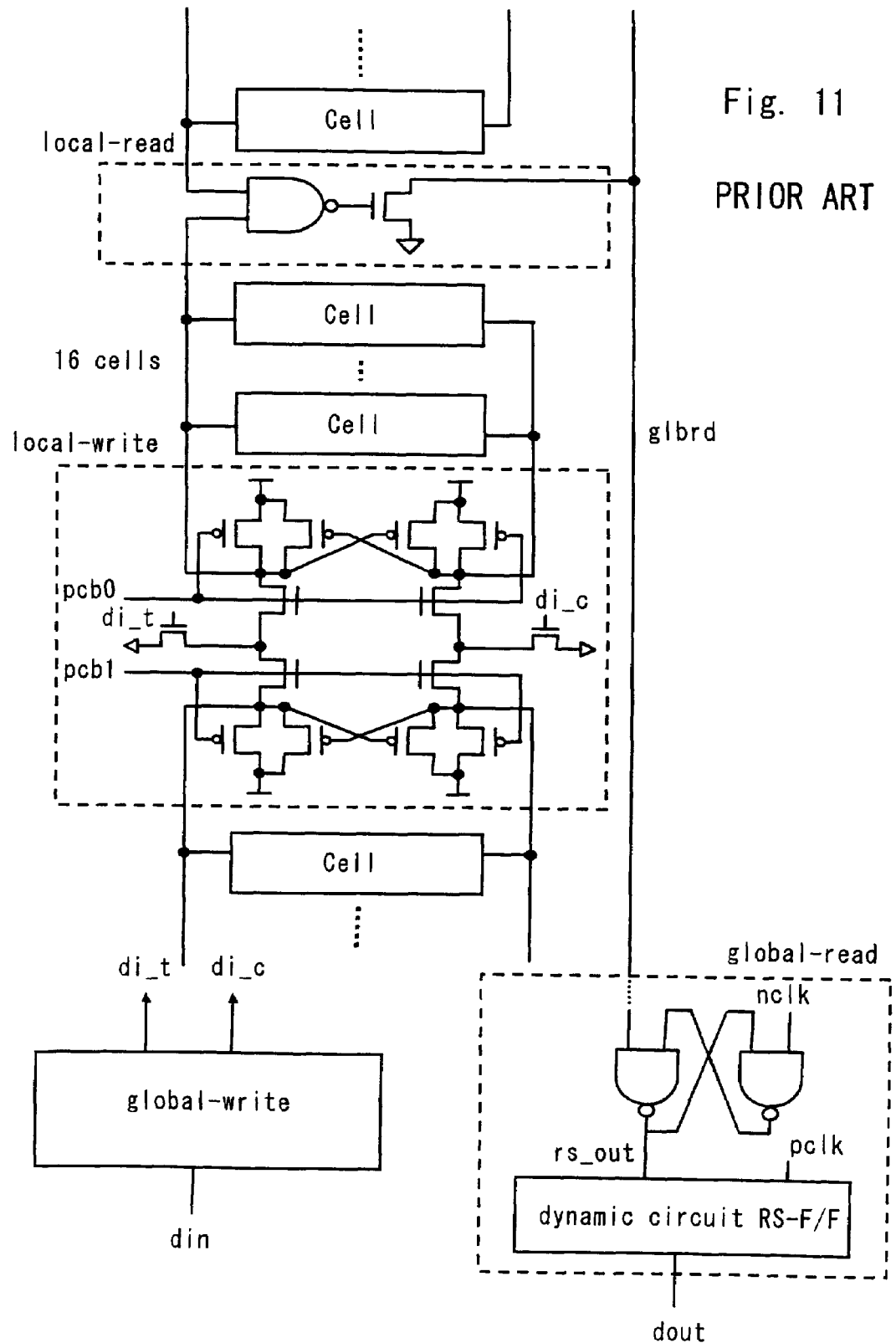
FIG. 11 illustrates an entire configuration example of a semiconductor memory apparatus according to a related art.

The first exemplary embodiment of the present invention adopts the differential method advantageous in respect of higher speed. The related art illustrated in FIG. 11 adopts the single-ended method. Therefore, in order to increase the speed, the transistor size of the local read circuit must be increased to nearly 10 times more.

In the first exemplary embodiment of the present invention, the read and write operations of data from/to the first SRAM cell 101 can be controlled only by controlling the operations of the sense amplifier circuit 304 and the driver circuit 305. That is, in the read and the write operations of data, the first and the second SRAM cells are selected by the word line driver circuit 303 in the same control sequence. Therefore, it is not necessary to provide a control circuit required when the read and write operations are executed by different control sequences. Thus this exemplary embodiment can restrain from increasing the circuit size.

The present invention is not limited to the above exemplary embodiment but may be modified within the scope of the present invention. For example, in the SRAM cell array 202 illustrated in FIG. 1, a case is described as an example in which n number of the second SRAM cells 102 are controlled by one sense amplifier enable circuit 103 via the sense amplifier enable signal SAN. However, it is not limited to this. The circuit configuration can be changed as appropriate, for example, to the SRAM cell array 202 including multiple (any integer from 2 to n) sense amplifier enable circuits 103, and each of the multiple sense amplifier enable circuits 103 controls the corresponding second SRAM cells 102. More specifically, if two sense amplifier enable circuits 103 are provided, the sense amplifier enable signals SAN output from each of the sense amplifier enable circuits 103 respectively control n/2 number of the second SRAM cell 102.

Moreover, FIG. 1 illustrates the example in which one sense amplifier enable circuit 103 is provided to one SRAM cell array 202, however it is not limited to this. It may be the circuit configuration in which multiple (integer of 2 or more) SRAM cell arrays 202 share one sense amplifier enable circuit 103.

For example, in FIG. 1, n number of the second SRAM cells 102 are connected to one pair of the second bit line pair GBL0 and GBL1. However, it is not limited to this. It may be the circuit configuration in which multiple (any integer from 2 to n) second bit line pairs GBL0 and GBL1 are provided, and n number of the second SRAM cells 102 are connected to the corresponding second bit line pairs GBL0 and GBL1. Such circuit configuration enables to suppress the load capacity of the second bit line pair GBL0 and GBL1 and also increases the speed in the data write/read operations. Note that in a case that the multiple second bit line pairs GBL0 and GBL1 are provided, in a case that the number of column addresses is increased to n or more, and in a case that multiple second bit line pairs GBL0 and GBL1 are provided to connect with the corresponding SRAM blocks 301, the selector circuit SEL is required for selecting a bit line pair among the multiple bit line pair.

Figure 14:
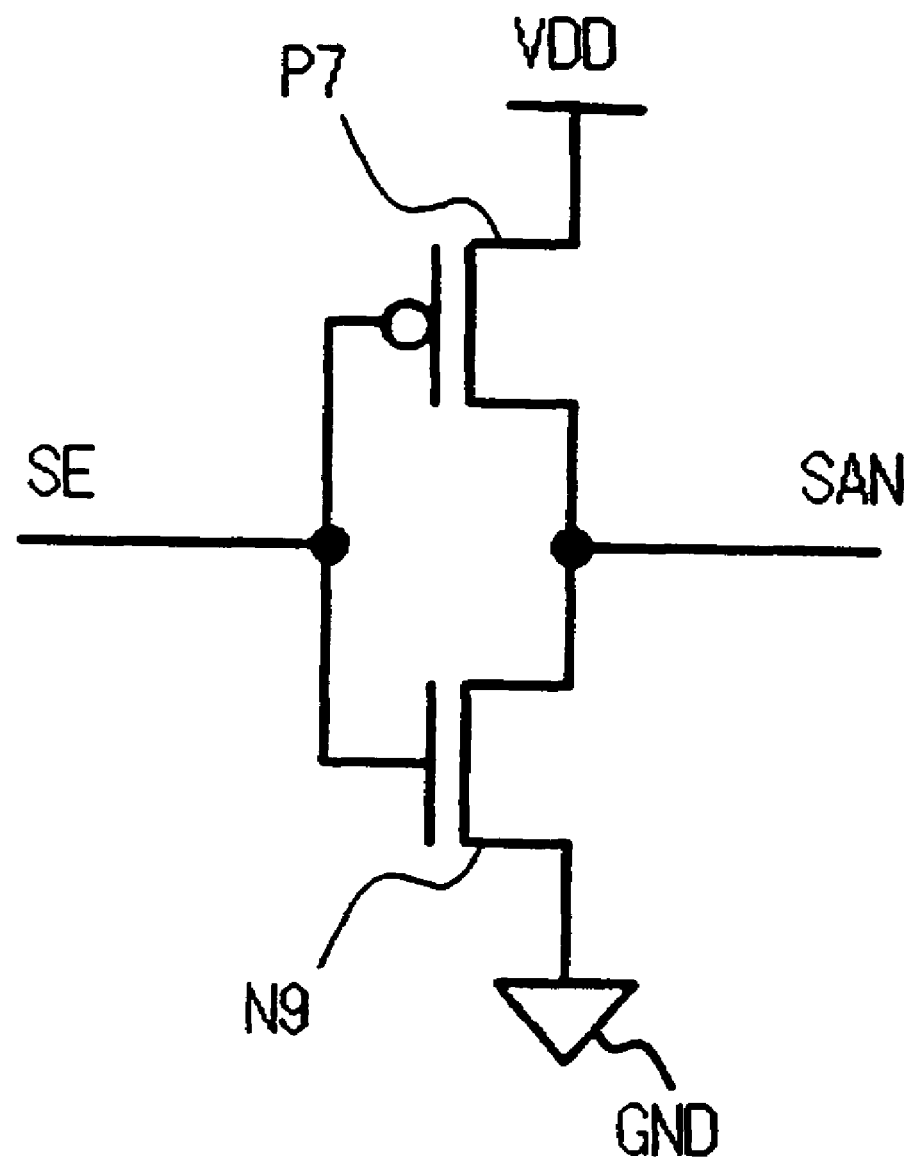
FIG. 14 illustrates a second mode of a sense amplifier enable circuit used in the present invention.

Further, the sense amplifier enable circuit 103 is not limited to the circuit configuration illustrated in FIG. 3 which includes only the NMOS transistor N9. The sense amplifier enable circuit 103 can be changed to the circuit configuration including a PMOS transistor N9 in addition to the NMOS transistor N9 as illustrated in FIG. 14. Note that in the circuit illustrated in FIG. 14, N9 and P7 make up an inverter.

Figure 6:
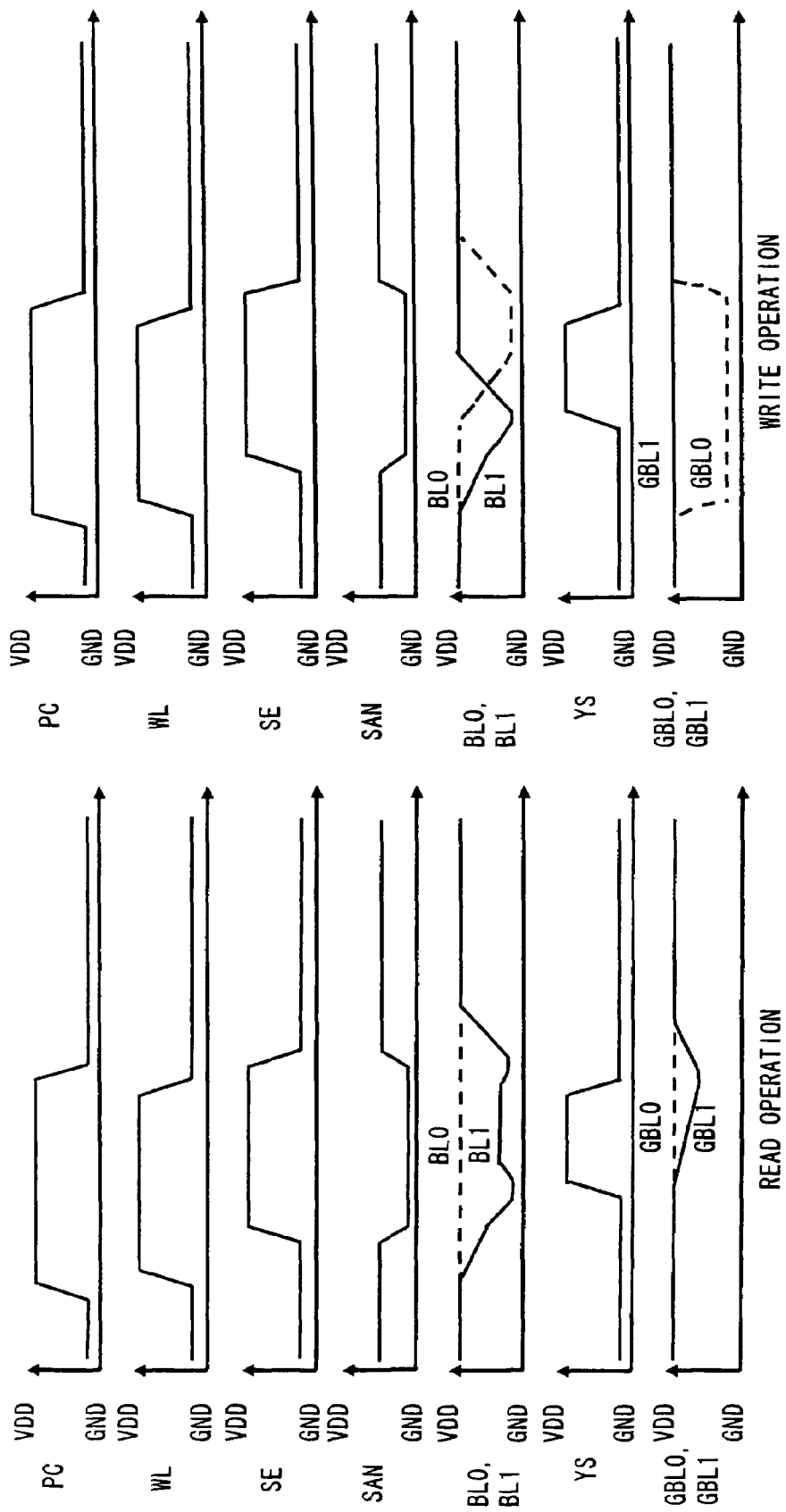
FIG. 6 is a timing chart depicting a read operation and a write operation of the semiconductor memory apparatus according to the first exemplary embodiment of the present invention.

In the circuit illustrated in FIG. 3, while the NMOS transistor N9 is turned off, the signal SAN enters a floating state as illustrated in FIG. 6. Therefore, there is a possibility that the second SRAM cells 102 interfere mutually via the signal SAN and causes a malfunction. On the other hand, in the case of the circuit illustrated in FIG. 14, while the NMOS transistor N9 is turned off, the PMOS transistor P7 is turned on to clamp the signal SAN at a constant potential. This enables to prevent the abovementioned malfunction when using the circuit illustrated in FIG. 3. Note that the purpose of the circuit illustrated in FIG. 14 is to clamp the signal SAN at a constant potential, thus the PMOS transistor P7 can be substantially smaller than N9. That is, the circuit size hardly increases by adding P7.

[Second Exemplary Embodiment]

Figure 7:
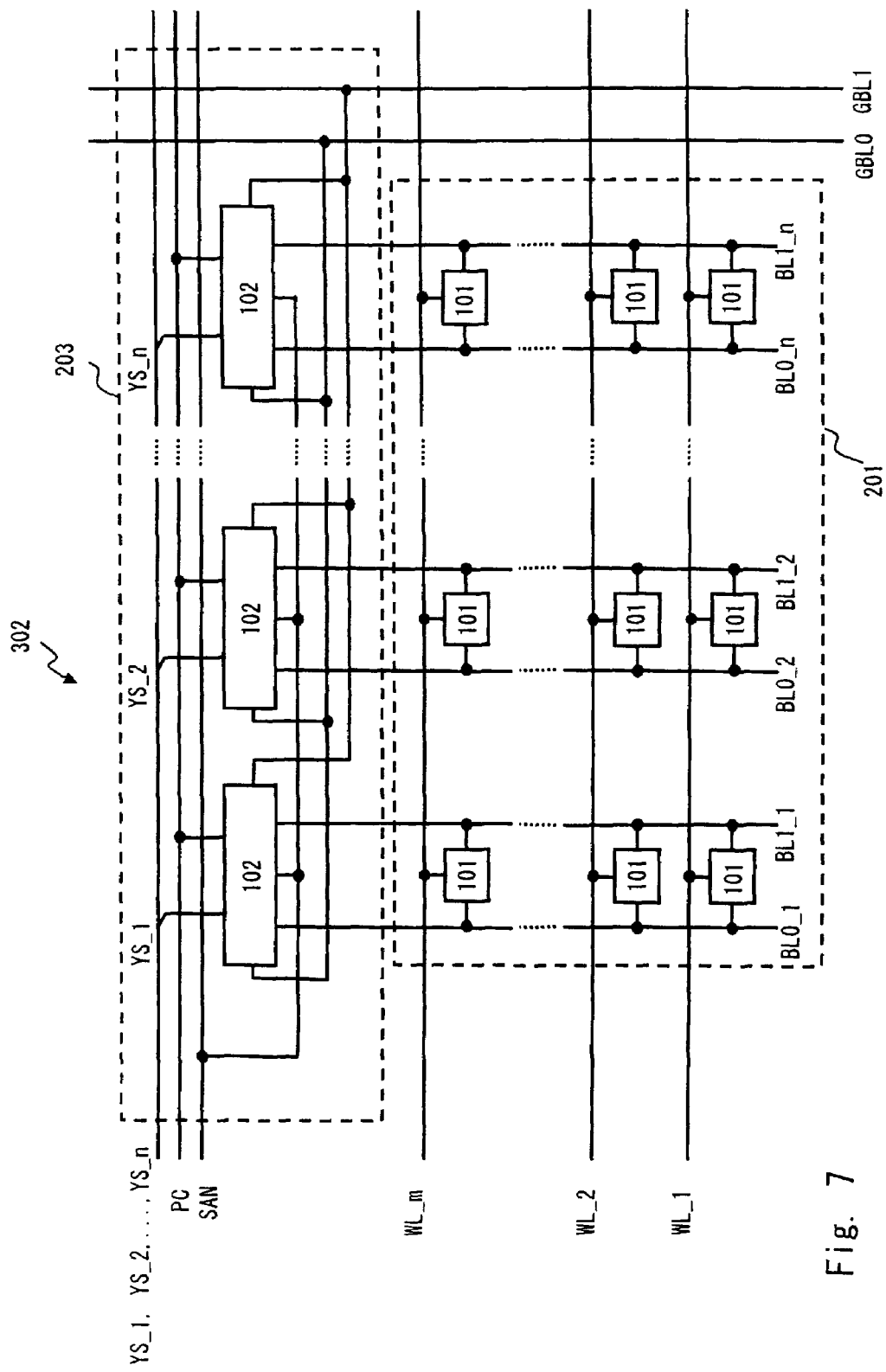
FIG. 7 illustrates an SRAM block according to the second exemplary embodiment of the present invention.

FIG. 7 illustrates the basic configuration of a SRAM block (SRAM circuit) 302 included in a semiconductor memory apparatus according to the second exemplary embodiment of the present invention. The SRAM block 302 of the present invention is provided with a SRAM cell array 201 for storing data and a SRAM cell array 203 for transmitting and receiving signals to/from outside. The SRAM block 302 is provided with a first word line WL, a second word line YS, a sense amplifier enable signal SAN, a precharge enable signal PC, a first bit line pair BL0 and BL1, and a second bit line pair GBL0 and GBL1. The SRAM cell array 201 includes m×n (m and n are integers of 1 or more) number of SRAM cells 101 arranged in a matrix. The SRAM cell array 203 includes n (n is an integer of 1 or more) number of the second SRAM cells 102 arranged in the row direction.

As compared with the circuit of the first exemplary embodiment of the present invention illustrated in FIG. 1, the circuit of FIG. 7 does not include the sense amplifier enable circuit 103 in order to reduce the circuit area. Accordingly, the circuit of FIG. 7 includes the sense amplifier enable signal SAN wired in the row direction as an output signal from the word line driver circuit 306 instead of the sense amplifier control signal SE of FIG. 1. Note that the function included in the sense amplifier enable circuit 103 is provided to the word line driver circuit 306.

To the SRAM cell array 203, n number of the second word lines YS wired in the row direction, one sense amplifier enable signal SAN and one precharge enable signal PC wired in the row direction, and one pair of the second bit line pair GBL0 and GBL1 wired in the column direction are connected. In the following explanation, each of the n number of the second word lines YS are denoted as the second word line YS_j (j is any integer from 1 to n). Among the n number of the second SRAM cells 102 provided to the SRAM cell array 203 and arranged in the row direction, the second SRAM cell 102 placed in the $i^{th}$ column is connected to the second word line YS_j. Each of the second SRAM cells 102 is connected to the precharge enable signal PC, one pair of the second bit line pair GBL0 and GBL1, and the sense amplifier enable signal SAN. Other circuit configuration is same as the circuit according to the first exemplary embodiment illustrated in FIG. 1.

Figure 8:
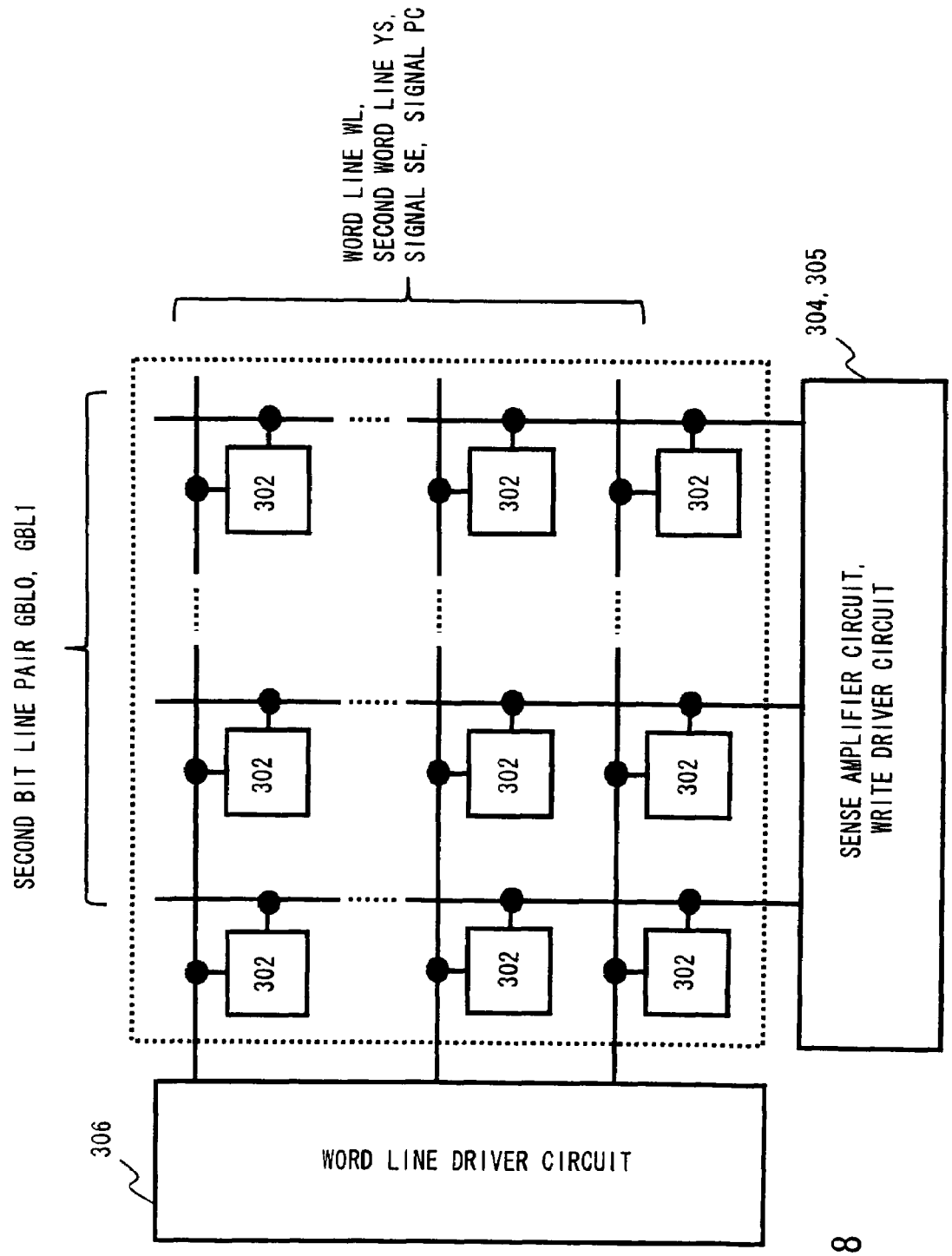
FIG. 8 illustrates an entire configuration example of a semiconductor memory apparatus according the second exemplary embodiment of the present invention.

FIG. 8 illustrates the entire configuration of the semiconductor memory apparatus according to the second exemplary embodiment of the present invention. In the example of the circuit illustrated in FIG. 8, one or more SRAM blocks 302 arranged in a matrix, a word line driver circuit 306, a sense amplifier 304, and a write driver circuit 305 are provided.

The first word line WL, the second word line YS, the sense amplifier enable signal SAN, and the precharge enable signal PC connected to the word line driver circuit 306 are wired in the row direction. Then, the first word line WL, the second word line YS, the sense amplifier enable signal SAN, and the precharge enable signal PC are connected to each of the SRAM blocks 302. The second bit line pair GBL0 and GBL1 connected to the sense amplifier circuit 304 and the write driver circuit 305 are wired in the column direction. Then, the second bit line pair GBL0 and GBL1 is connected to each of the corresponding SRAM blocks 302.

Figure 9:
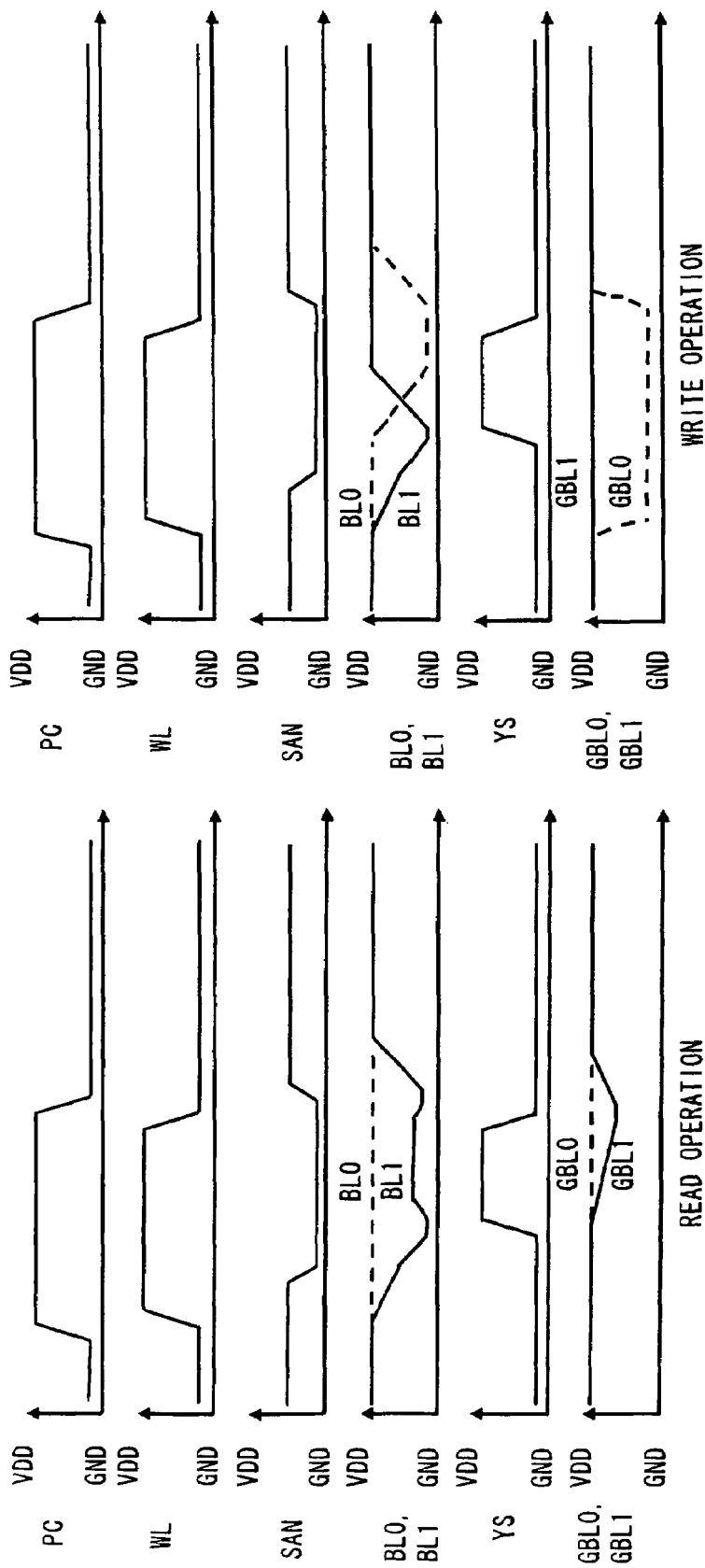
FIG. 9 is a timing chart depicting a read operation and a write operation of the semiconductor memory apparatus according to the second exemplary embodiment of the present invention.
Figure 10:
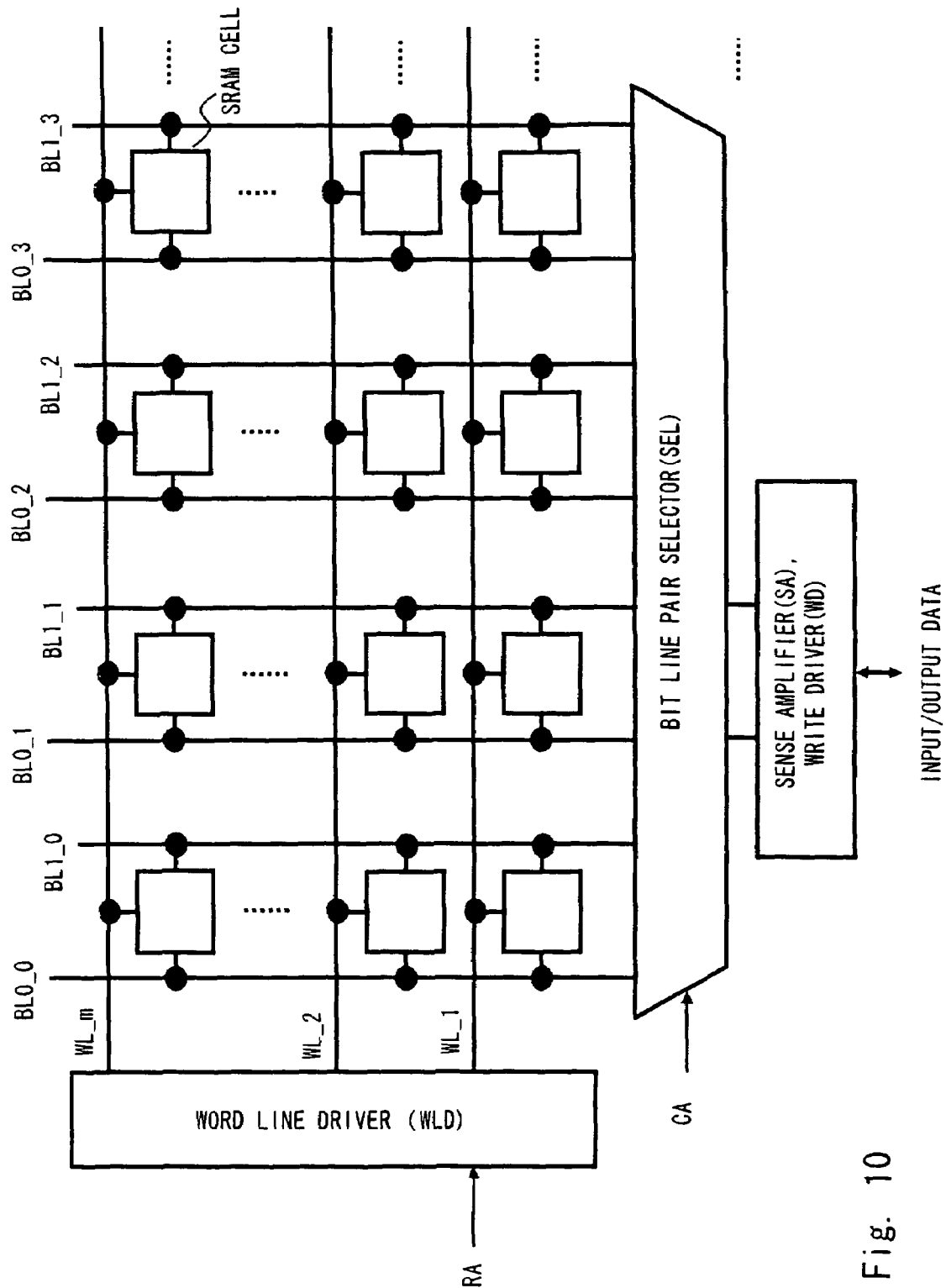
FIG. 10 illustrates an entire configuration example of a semiconductor memory apparatus according to a related art.

Next, the operation of the semiconductor memory apparatus according to the second exemplary embodiment of the present invention is explained with reference to FIG. 9. At standby time, voltage levels of all of the first word line WL, all of the second word line YS, and the signal PC indicate the ground voltage GND. The voltage level of the signal SAN indicates the power supply voltage VDD or the intermediate potential between VDD and GND. As the first word line WL controls N3 and N4 to be OFF, the first SRAM cell 101 keeps holding the memory data, which has already been stored. Further, as the signal PC controls P5 and P6 to be ON, the power supply voltage VDD is supplied to the second memory node pair of the second SRAM cell 102, which is the first bit line pair BL0 and BL1. The second SRAM cell 102 is in the undefined state and does not hold memory data.

A read operation of the semiconductor memory apparatus according to the second exemplary embodiment of the present invention is explained hereinafter. The voltage levels of the second bit line pair GBL0 and GBL1 before the read operation indicate the power supply voltage VDD. In the SRAM block 302 including the SRAM cell array 201 having m×n (m and n are integers of 1 or more) number of the first SRAM cells 101 arranged in a matrix and the SRAM cell array 203 having n (n is an integer of 1 or more) number of the second SRAM cells 102 arranged in the row direction, a case is described when reading out memory data of the first SRAM cell 101 placed to the $i^{th}$ row (i is any integer from 1 to m) and the $j^{th}$ column (j is any integer from 1 to n).

Firstly, P5 and P6 are controlled to be OFF by the signal PC changing to the power supply voltage VDD. Next, N3 and N4 are controlled to be ON by the first word line WL_i connected to the first SRAM cell 101 changing to the power supply voltage VDD. Then, the memory data held in the first SRAM cell 101 is output to the first bit line pair BL0_J and BL1_j.

The voltage levels of the source terminals of N5 and N6 are changed to the ground voltage GND by the signal SAN changing to the ground voltage GND after a potential difference is generated between BL0_j and BL1_j. The second SRAM cell 102 amplifies the potential difference between the first bit line pair BL0_j and BL1_j (second memory node pair) and also holds the amplified memory data.

Then, the second word line YS_i (j is any integer from 1 to n) connected to the second SRAM cell 102 changes to the power supply voltage VDD to control N7 and N8 to be ON. Then the memory data held in the second SRAM cell 102 is output to the second bit line pair GBL0 and GBL1. After a potential difference is generated between GBL0 and GBL1, the sense amplifier circuit 304 connected to the second bit line pair GBL0 and GBL1 amplifies the potential difference and outputs the amplified potential difference as a read signal. The second SRAM cell 102 has a function as a local read circuit which controls the read operation of m (m is an integer of 1 or more) number of the first SRAM cells 101 placed in the $j^{th}$ column, for example.

A write operation of the semiconductor memory apparatus according to the second exemplary embodiment of the present invention is explained hereinafter. Note that the voltage level of the second bit line pair GBL0 and GBL1 before the write operation indicates the power supply voltage VDD. In the SRAM block 302 including the SRAM cell array 201 having m×n (m and n are integers of 1 or more) number of the first SRAM cells 101 arranged in a matrix and the SRAM cell array 203 having n (n is an integer of 1 or more) number of the second SRAM cells 102 arranged in the row direction, a case is described when writing memory data to the first SRAM cell 101 placed to the $i^{th}$ row (i is any integer from 1 to m) and the $i^{th}$ column (j is any integer from 1 to n).

Firstly, P5 and P6 are controlled to be OFF by the signal PC changing to the power supply voltage VDD. Next, N3 and N4 are controlled to be ON by the first word line WL_i connected to the first SRAM cell 101 changing to the power supply voltage VDD. Further, the voltage levels of the source terminals of N5 and N6 are changed to the ground voltage GND by the signal SAN changing to the ground voltage GND.

On the other hand, the write driver circuit 305 connected to the second bit line pair GBL0 and GBL1 discharges one of GBL0 and GBL1 to generate a potential difference between GBL0 and GBL1.

N7 and N8 provided to the second SRAM cell 102 are controlled to be ON by the second word line YS_j changing to the power supply voltage VDD. Then, signals of the second bit line pair GBL0 and GBL1 are input respectively to the first bit line pair BL0_j and BL1_j (second memory pair). The second SRAM cell 102 amplifies the potential difference of the second memory node pair and also holds the amplified memory data.

As N3 and N4 provided to the first SRAM cell 101 are turned on, the memory data amplified by the second SRAM cell 102 is written to the first SRAM cell 101 via the first bit line pair BL0_j and BL1_j. The second SRAM cell 102 has a function as a local write circuit which controls the write operation of m (m is an integer of 1 or more) number of the first SRAM cells 101 placed in the $j^{th}$ column, for example.

As described above, in the second exemplary embodiment of the present invention, the second SRAM cell 102 provided to the SRAM cell array 203 has functions as local read/write circuits and thus can be composed of less number of transistors than related arts. This enables to increase the number of dividing the SRAM cell array. As a result, the read margin of an SRAM cell can be improved and the operation speed can be increased.

The second exemplary embodiment of the present invention adopts the differential method advantageous in respect of higher speed. The related art illustrated in FIG. 11 adopts the single-ended method. Therefore, in order to increase the speed, the transistor size of the local read circuit must be increased to nearly 10 times more.

In the first exemplary embodiment of the present invention, the read and write operations of data from/to the first SRAM cell 101 can be controlled only by controlling the operations of the sense amplifier circuit 304 and the driver circuit 305. That is, in the read and the write operations of data, the first and the second SRAM cells are selected by the word line driver circuit 306 in the same control sequence. Therefore, it is not necessary to provide a control circuit required when the read and write operations are executed by different control sequences. Thus this exemplary embodiment can restrain from increasing the circuit size.

The present invention is not limited to the above exemplary embodiments but may be modified within the scope of the present invention. For example, in FIG. 7, n number of the second SRAM cells 102 are connected to one pair of the second bit line pair GBL0 and GBL1. However, it is not limited to this. It may be the circuit configuration in which multiple (any integer from 2 to n) second bit line pairs GBL0 and GBL1 are provided, and n number of the second SRAM cells 102 are connected to the corresponding second bit line pairs GBL0 and GBL1. Such circuit configuration enables to suppress the load capacity of the second bit line pair GBL0 and GBL1 and also increases the speed in the data write/read operations. Note that in a case that the multiple second bit line pairs GBL0 and GBL1 are provided, in a case that the number of column addresses is increased to n or more, and in a case that multiple second bit line pairs GBL0 and GBL1 are provided to connect with the corresponding SRAM blocks 302, the selector circuit SEL is required for selecting a bit line pair among the multiple bit line pair. It is further noted that the circuit of the related art illustrated in FIG. 12 does not assume the write operation, thus a local write circuit is required. Therefore, the circuit of the related art illustrated in FIG. 12 may increase its circuit size. On the other hand, the semiconductor memory apparatuses of the above exemplary embodiments are provided with the second SRAM cell 102 which includes functions of both local read/write circuits, thereby enabling to restrain from increasing the circuit size.

Figure 13:
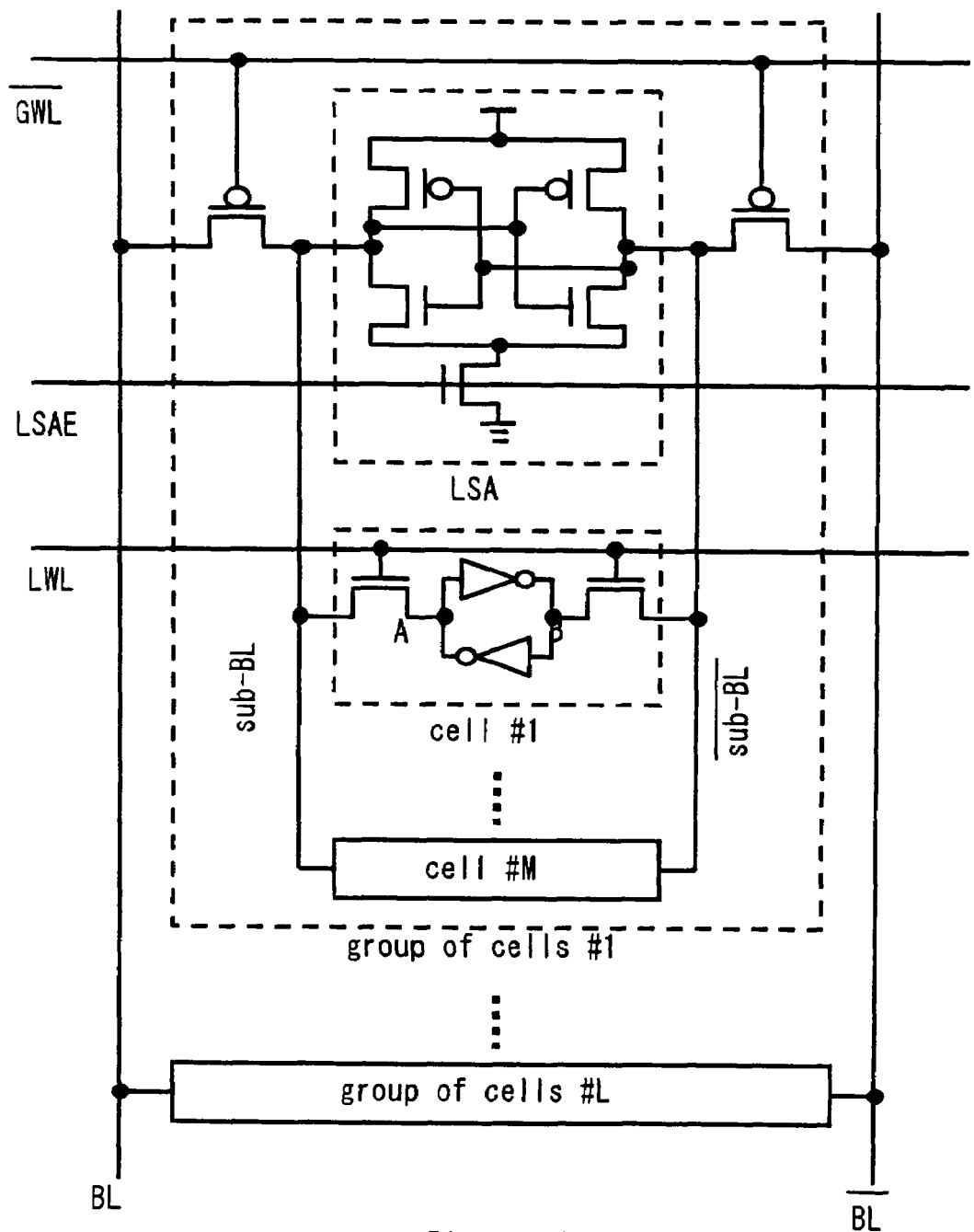
FIG. 13 illustrates an entire configuration example of a semiconductor memory apparatus according to a related art.

Further, in the circuit of the related art illustrated in FIG. 13, one word line GWL for controlling the access transistors to be ON/OFF is connected to the multiple local sense amplifiers (corresponding to the second SRAM cell in the above exemplary embodiments). This increases the number of pseudo operating SRAM cells (corresponding to the first SRAM cell in the above exemplary embodiments), thereby increasing the power consumption. Furthermore, in the circuit of FIG. 13, a data read operation and a data write operation are executed in different control sequences from each other. Thus the circuit size may increase. On the other hand, in the semiconductor memory apparatus according to the above exemplary embodiments, different second word lines YS_j are connected to the corresponding second SRAM cells 102. Therefore, it is possible to restrain from increasing the power consumption. Furthermore, in the semiconductor memory apparatus according to the above exemplary embodiments, in data reading/writing time, the first SRAM cell 101 and the second SRAM cell 102 are selected in the same control sequence. This enables to restrain from increasing the circuit size.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory apparatus comprising:
    a plurality of SRAM (Static Random Access Memory) circuits connected to a bit line pair;
    a word line control circuit;
    a sense amplifier circuit and
    a write control circuit,
    wherein each of said plurality of SRAM circuits comprises:
        a plurality of first SRAM cells that store data;
        a second SRAM cell that amplifies a potential difference corresponding to a data status and stores the potential difference; and
        a sub bit line pair that connects said plurality of first SRAM cells to an inverter pair disposed in said second SRAM cell, an output of one inverter of said inverter pair being connected to an input of another inverter of said inverter pair, and an output of the other inverter of said inverter pair being connected to an input of the one inverter of said inverter pair,
    wherein said word line control circuit outputs a first set of control signals for selecting one first SRAM cell to be read/written the data from said plurality of first SRAM cells of said plurality of SRAM circuits, and a second set of control signals for selecting one second SRAM cell to be read/written the potential difference from the second SRAM cells of said plurality of SRAM circuits,
    wherein a plurality of first control signals constituting the first set of control signals are connected to respective first SRAM cells disposed in one of said plurality of SRAM circuits and also connected to respective first SRAM cells disposed in another one of said plurality of SRAM circuits,
    wherein said sense amplifier circuit amplifies a potential difference of a read signal, the read signal being output from a bit line pair of the second SRAM cell selected according to the second control signals, and
    wherein said write control circuit outputs a write signal to the bit line pair of the second SRAM cell selected according to the second control signals.

2. The semiconductor memory apparatus according to claim 1, wherein
    the first SRAM cell is selected to be read/written the data according to the first control signal and the second control signal by a memory node pair of the second SRAM cell being connected to a sub bit line pair of the first SRAM cell.

3. The semiconductor memory apparatus according to claim 1, wherein the second SRAM cell comprises:
    an access transistor that switches a connection state of a memory node pair of the second SRAM cell and the bit line pair of the second SRAM cell according to the second control signal; and
    a precharge transistor that switches a connection state of the memory node pair and a high potential side power supply terminal according to a precharge enable signal output from the word line control circuit,
    wherein an amplification of a potential difference corresponding to the data status in the memory node pair is controlled according to an amplification control signal input to a low potential side power supply terminal.

4. The semiconductor memory apparatus according to claim 1, wherein
    in the second SRAM cell, a high potential side power supply terminal and a low potential side power supply terminal of the inverter pair are connected to a first power supply and a voltage control node respectively, and
    a voltage level of the voltage of the voltage control node is controlled according to the word line control circuit.

5. The semiconductor memory apparatus according to claim 4, wherein
    the SRAM circuit further comprises an amplification control circuit to which a voltage control signal is supplied from the word line control circuit,
    the amplification control circuit controls a voltage level of the voltage control node according to the voltage control signal.

6. The semiconductor memory apparatus according to claim 4, wherein the second SRAM cell comprises a pair of precharge transistors connected to the sub bit line pair.

7. The semiconductor memory apparatus according to claim 6,
    wherein the second SRAM cell further comprises a pair of access transistors that switches a connection state of a memory node pair of the second SRAM cell and the bit line pair according to the second control signal,
    wherein the inverter pair comprises:
        a first inverter including a first PMOS transistor and a first NMOS transistor, drains of the first PMOS transistor and the first NMOS transistor being connected to one of the sub bit line pair; and
        a second inverter including a second PMOS transistor and a second NMOS transistor, drains of the second PMOS transistor and the second NMOS transistor being connected to the other of the sub bit line pair,
    wherein the pair of access transistors comprises:
        a third NMOS transistor, one of a source and a drain of the third NMOS transistor being connected to an output of the first inverter, the other of the source and the drain of the third NMOS transistor being connected to one of the bit line pair, and a gate of the third NMOS transistor being connected to the second control signal; and a fourth NMOS transistor, one of a source and a drain of the fourth NMOS transistor being connected to an output of the second inverter, the other of the source and the drain of the fourth NMOS transistor being connected to the other of the bit line pair, and a gate of the fourth NMOS transistor being connected to the second control signal, and wherein the pair of precharge transistors comprises:

a third PMOS transistor, a drain of the third PMOS transistor being connected to one of the sub bit line pair, and a source of the third PMOS transistor being connected to a first power supply; and a fourth PMOS transistor, a drain of the fourth PMOS transistor being connected to the other of the sub bit line pair, and a source of the third PMOS transistor being connected to the first power supply.

8. The semiconductor memory apparatus according to claim 4, wherein in a read/write operation of the semiconductor memory apparatus, the word line control circuit changes a voltage level of the voltage control node from a low potential to a high potential, and then changes a control signal connected to the second SRAM cell to be read/written, among the second set of control signals, from a low potential to a high potential.

9. The semiconductor memory apparatus according to claim 1, wherein in the SRAM circuit, at least one or more of the first SRAM cells are placed in a matrix, at least one or more of the second SRAM cells are placed in a row direction, a sub bit line pair of the first SRAM cells placed to a column corresponding to the second SRAM cell placed to each column is connected to a memory node pair of the corresponding second SRAM cell, and reading/writing the potential difference of the data from/to each of the second SRAM cells are controlled by different second control signals.

10. The semiconductor memory apparatus according to claim 1, wherein in the semiconductor memory apparatus, at least one or more of the SRAM circuits are placed in a matrix, the SRAM circuits placed to each row are connected via the first control signal and the second control signal, the first control signal and the second control signal being common to each row of the SRAM circuits, and the SRAM circuits placed to each column are connected via a common bit line pair used as the read signal and the write signal.

11. The semiconductor memory apparatus according to claim 1, wherein the semiconductor memory apparatus further comprises a selector circuit that connects the SRAM circuits, the sense amplifier circuit, and the write control circuit, and selectively specifies a bit line pair used as the read signal or the write signal, the bit line pair is connected to the corresponding SRAM circuits.

12. The semiconductor memory apparatus according to claim 1, wherein the first SRAM cell and the second SRAM are selected at the time of a read operation and a write operation in a same control sequence.

13. The semiconductor memory apparatus according to claim 1, wherein the control sequence of the data read operation and the data write operation for the first SRAM cell and the second SRAM cell is carried out, for any operation, in order of an off operation of a precharge transistor of the second SRAM cell, a selection operation of the first SRAM cell, an amplification operation of the second SRAM cell, and a selection operation of the second SRAM cell.

14. A semiconductor memory apparatus comprising:

a plurality of SRAM (Static Random Access Memory) circuits connected a bit line pair; and a word line control circuit, wherein each of said plurality of SRAM circuits comprises:

a plurality of first SRAM cells that store data;

a second SRAM cell that amplifies a potential difference corresponding to the data status and stores the potential difference; and a sub bit line pair that connects said plurality of first SRAM cells to an inverter pair disposed in said second SRAM cell, an output of one inverter of said inverter pair being connected to an input of the other inverter of said inverter pair, and an output of the other inverter of said inverter pair being connected to an input of the one inverter of said inverter pair, wherein said word line control circuit outputs a first set of control signals for selecting one first SRAM cell to be read/written the data from said plurality of first SRAM cells of said plurality of SRAM circuits, and a second set of control signals for selecting one second SRAM cell to be read/written the potential difference from the second SRAM cells of said plurality of SRAM circuits, and wherein a plurality of first control signals constituting the first set of control signals are connected to respective first SRAM cells disposed in one of said plurality of SRAM circuits and also connected to respective first SRAM cells disposed in another one of said plurality of SRAM circuits.

15. The semiconductor memory apparatus according to claim 14, wherein in the second SRAM cell, a high potential side power supply terminal and a low potential side power supply terminal of the inverter pair are connected to a first power supply and a voltage control node respectively, and a voltage level of the voltage of the voltage control node is controlled according to the word line control circuit.

16. The semiconductor memory apparatus according to claim 15, wherein the second SRAM cell comprises a pair of precharge transistors connected to the sub bit line pair.

17. The semiconductor memory apparatus according to claim 16, wherein in a read/write operation of the semiconductor memory apparatus, the word line control circuit changes a voltage level of the voltage control node from a low potential to a high potential, and then changes a control signal connected to the second SRAM cell to be read/written, among the second set of control signals, from a low potential to a high potential.

18. The semiconductor memory apparatus according to claim 14, wherein the second SRAM cell comprises a pair of precharge transistors connected to the sub bit line pair.

19. The semiconductor memory apparatus according to claim 18, wherein the second SRAM cell further comprises a pair of access transistors that switches a connection state of a memory node pair of the second SRAM cell and the bit line pair according to the second control signal, wherein the inverter pair comprises:

a first inverter including a first PMOS transistor and a first NMOS transistor, drains of the first PMOS transistor and the first NMOS transistor being connected to one of the sub bit line pair; and a second inverter including a second PMOS transistor and a second NMOS transistor, drains of the second PMOS transistor and the second NMOS transistor being connected to the other of the sub bit line pair, wherein the pair of access transistors comprises:
  a third NMOS transistor, one of a source and a drain of the third NMOS transistor being connected to an output of the first inverter, the other of the source and the drain of the third NMOS transistor being connected to one of the bit line pair, and a gate of the third NMOS transistor being connected to the second control signal; and
  a fourth NMOS transistor, one of a source and a drain of the fourth NMOS transistor being connected to an output of the second inverter, the other of the source and the drain of the fourth NMOS transistor being connected to the other of the bit line pair, and a gate of the fourth NMOS transistor being connected to the second control signal, and wherein the pair of precharge transistors comprises:
  a third PMOS transistor, a drain of the third PMOS transistor being connected to one of the sub bit line pair, and a source of the third PMOS transistor being connected to a first power supply; and
  a fourth PMOS transistor, a drain of the fourth PMOS transistor being connected to the other of the sub bit line pair, and a source of the third PMOS transistor being connected to the first power supply.

* * * * *